(12) United States Patent
Gejima et al.

(10) Patent No.: US 8,125,088 B2
(45) Date of Patent: Feb. 28, 2012

(54) SEMICONDUCTOR DEVICE

(75) Inventors: Fumihiko Gejima, Yokohama (JP);
Hiroki Sakamoto, Yokohama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 229 days.

(21) Appl. No.: 12/673,082

(22) PCT Filed: Sep. 8, 2008

(86) PCT No.: PCT/IB2008/002370
§ 371 (c)(1),
(2), (4) Date: Feb. 11, 2010

(87) PCT Pub. No.: WO2009/034454
PCT Pub. Date: Mar. 19, 2009

(65) Prior Publication Data
US 2011/0309512 A1 Dec. 22, 2011

(30) Foreign Application Priority Data

Sep. 14, 2007 (JP) .................................. 2007-240073
May 12, 2008 (JP) .................................. 2008-124703

(51) Int. Cl.
*H01L 23/48* (2006.01)

(52) U.S. Cl. ................. 257/778; 257/777; 257/780

(58) Field of Classification Search .................. 257/777, 257/778, 780
See application file for complete search history.

(56) References Cited

U.S. PATENT DOCUMENTS
2006/0214291 A1 9/2006 Sasaki et al.

FOREIGN PATENT DOCUMENTS
| EP | 0 661 748 A1 | 7/1995 |
|---|---|---|
| JP | 60-257141 | 12/1985 |
| JP | 7-221265 | 8/1995 |
| JP | 2002-231883 A | 8/2002 |
| JP | 2004-14599 A | 1/2004 |

*Primary Examiner* — Samuel Gebremariam
(74) *Attorney, Agent, or Firm* — Young Basile

(57) ABSTRACT

Embodiments of the invention provide a semiconductor device having high reliability as they ease the thermal stress or a heat distortion or strain occurring during the manufacturing process or during operation, and the embodiments function with stability for a long time. A semiconductor device has a semiconductor substrate, an insulating ceramic plate on which the semiconductor substrate is mounted and stress buffer 40 that eases a thermal stress. The stress buffer is provided between the semiconductor substrate and the insulating ceramic plate and can be provided on a surface of the insulating ceramic plate that is opposite to a surface on which the semiconductor substrate is mounted. The stress buffer is formed from a structure including at least Al and a second phase. The second phase is $Al_4X$ where X is at least one element of alkaline earth metal elements.

13 Claims, 12 Drawing Sheets

FIG. 14

| No. | COMPONENT Ca QUANTITY [at. %] | COMPONENT OTHERS | COMPONENT Al | OBSERVATION OF COMPONENT PHASE | VOLUME FRACTION [%] OF Al4Ca PHASE | YOUNG'S MODULUS [GPa] | TENSILE STRENGTH [MPa] | AVERAGE LINEAR EXPANSION COEFFICIENT IN TEMPERATURE RANGE FROM -50°C TO 300°C [ppm/K] | HEAT CONDUCTIVITY [W/mK] | ELECTRIC CONDUCTIVITY [%IACS] | DENSITY [g/cm³] |
|---|---|---|---|---|---|---|---|---|---|---|---|
| ALLOY 1 | 5 | | RESIDUAL | Al + Al4Ca | 26 | 55 | 274 | 22.0 | 139 | 42.1 | 2.58 |
| ALLOY 2 | 9 | | RESIDUAL | Al + Al4Ca | 47 | 43.5 | 285 | 19.0 | 108 | 25.3 | 2.49 |
| ALLOY 3 | 12 | | RESIDUAL | Al + Al4Ca | 62 | 34 | 185 | 17.7 | 77.6 | 27.7 | 2.44 |
| COMPARISON EXAMPLE 1 | 0 | A1070 | RESIDUAL | — | 0 | 68 | 68 | 23.5 | 225 | 62 | 2.70 |
| COMPARISON EXAMPLE 2 | 0 | A4032 ALLOY | RESIDUAL | — | 0 | 77 | 380 | 20.0 | 145 | NOT MEASURED | 2.68 |

FIG. 15

| | THICKNESS [μm] | ELASTIC MODULUS [GPa] | LINEAR EXPANSION COEFFICIENT [ppm/K] | POISSON'S RATIO |
|---|---|---|---|---|
| SEMICONDUCTOR CHIP | 300 | 400 | 3.5 | 0.18 |
| INTERMEDIATE LAYER | 100 | CHANGED FROM 20 TO 80 | CHANGED FROM 10 TO 25 | 0.35 |
| WIRING METAL LAYER | 400 | CHANGED FROM 20 TO 80 | CHANGED FROM 10 TO 25 | 0.35 |
| INSULATING CERAMIC PLATE | 635 | 300 | 4.5 | 0.3 |
| BACKSIDE METAL LAYER | 400 | CHANGED FROM 20 TO 80 | CHANGED FROM 10 TO 25 | 0.35 |

SEMICONDUCTOR DEVICE

CROSS-REFERENCE TO RELATED APPLICATIONS

This application claims priority from Japanese Patent Application Serial No. 2007-240073, filed Sep. 14, 2007 and No. 2008-124703, filed May 12, 2008, each of which is incorporated herein in its entirety by reference.

TECHNICAL FIELD

The invention relates to a semiconductor device.

BACKGROUND

A typical semiconductor device has a semiconductor base or substrate, i.e. a semiconductor chip, and an insulating substrate on which the semiconductor chip is mounted. The semiconductor chip is connected or bonded with the insulating substrate via solder. In such a semiconductor device having a solder bonding portion, when a calorific or heating value of the semiconductor chip becomes a heating value that is beyond a melting point of the solder, the solder melts and a function of the semiconductor device stops. For this reason, an operating or working temperature of the semiconductor device must be at least under the melting point of the solder. Here, as the solder, for example, a typical lead-free solder of Sn—Ag—Cu is used, and its melting point is about 220° C.

The higher the power of a circuit including the semiconductor device, or the higher the reliability required of the semiconductor device (such as stability with time, thermal stability (heat resistance), and moisture resistance), the higher the insulation performance is required. As the thermal stability, thermal stability in a case where current used in the semiconductor device is large and heat produced in the semiconductor base becomes great, is included. Such a semiconductor device that produces the large heating value and needs high reliability has been required recently.

To meet these requirements, there has been proposed a technique in which the semiconductor chip is directly connected or bonded with the insulating substrate without using the solder in Japanese Patent Provisional Publication No. 2004-014599 (hereinafter is referred to as "JP2004-014599"). In a semiconductor device in JP2004-014599, a surface of an electrode of the semiconductor chip and a surface of a circuit pattern on the insulating substrate are formed by the same material. Then by applying ultrasonic vibration with pressurization under a condition in which the electrode surface and the circuit pattern surface face each other, the both surfaces are directly bonded with each other with solderless connection.

BRIEF SUMMARY

According to one embodiment of the invention, a semiconductor device comprises a semiconductor base, an insulating ceramic plate on which the semiconductor base is mounted and stress buffers that ease a thermal stress and are provided between the semiconductor base and the insulating ceramic plate. The stress buffer is formed from a structure that contains at least Al and a second phase. The second phase is $Al_4X$ wherein X is at least one element of alkaline earth metal elements.

With embodiments of the invention as described herein, a semiconductor device that lessens the thermal stress or a heat distortion or strain occurring during the manufacturing process and/or during operation and that functions with stability for a long time can be obtained.

BRIEF DESCRIPTION OF THE DRAWINGS

The description herein makes reference to the accompanying drawings wherein like reference numerals refer to like parts throughout the several views, and wherein:

FIG. 14 is a table including components and measurement results of alloys that contain $Al_4Ca$ in Al compared to data of A4032 of a normal Al alloy; and FIG. 15 is a table showing the thickness and properties for a semiconductor chip, an intermediate layer, a wiring metal layer, an insulating ceramic plate and a backside metal layer in the model shown in FIG. 5.

DETAILED DESCRIPTION OF EMBODIMENTS OF THE INVENTION

In conventional semiconductor devices, the solder serves to ease or lessen a difference of the thermal expansion coefficient between a wiring metal on the semiconductor chip side and a wiring metal on the circuit pattern side. Since the semiconductor device disclosed in JP2004-014599 has no solder having the above function, when a large temperature difference is repeatedly applied to the semiconductor device, stress concentrates at an interface portion due to a thermal stress. There is, accordingly, a risk that a crack will occur. Further, the semiconductor device disclosed in JP2004-014599 is required to control surface smoothness of each surface, and a sophisticated process is needed, resulting in high costs.

In contrast, embodiments of the invention taught herein provide a semiconductor device having high reliability that lessens the thermal stress or a heat distortion or strain occurring during the manufacturing process and/or during operation and functions with stability for a ling time. Hereinafter, certain embodiments of the invention are explained in detail with reference to the drawings.

Figure 1:
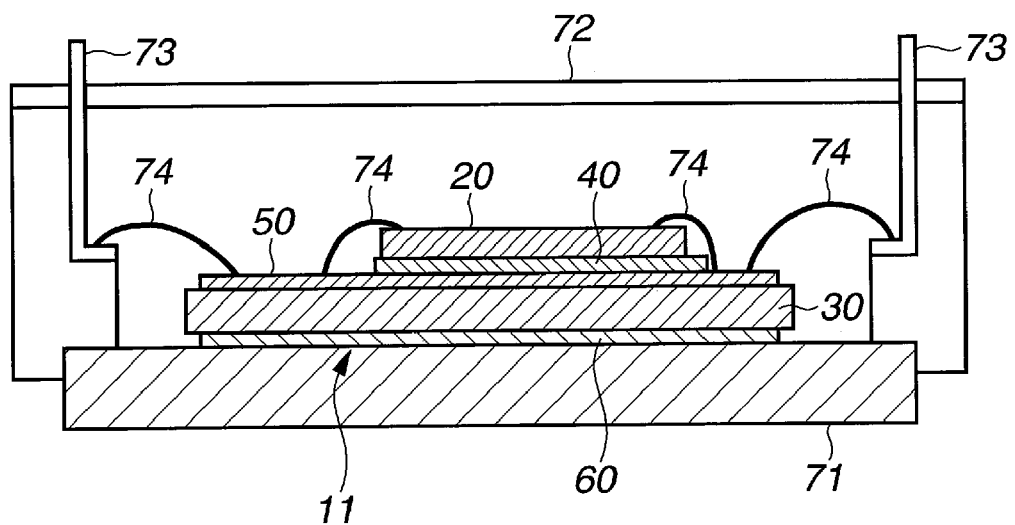
FIG. 1 is a sectional view showing a package configuration of a semiconductor device according to a first embodiment of the invention.
Figure 2A:
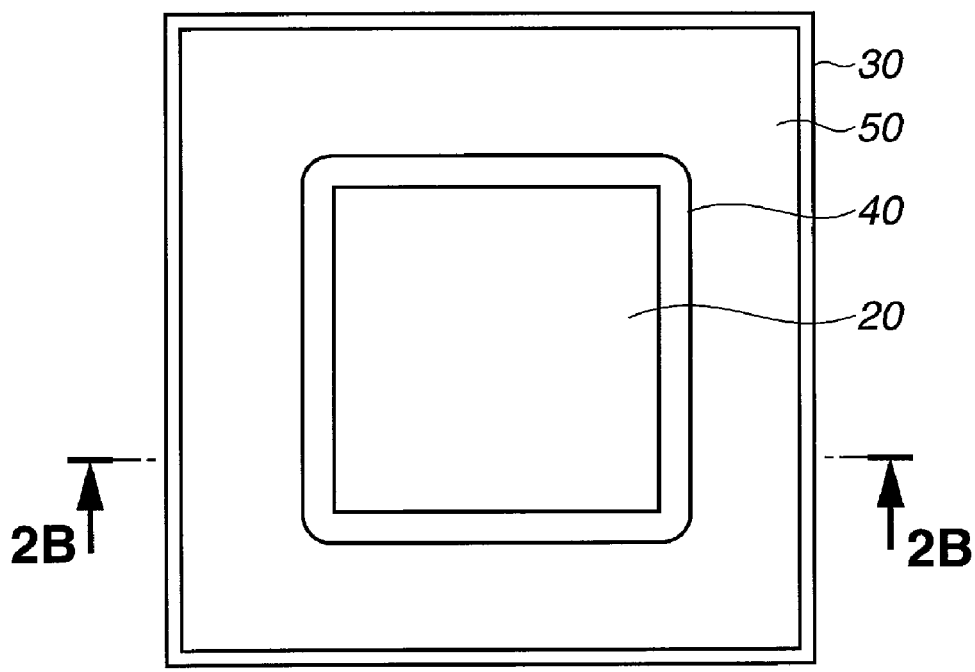
FIG. 2A is a plan view of the semiconductor device according to the first embodiment.
Figure 2B:
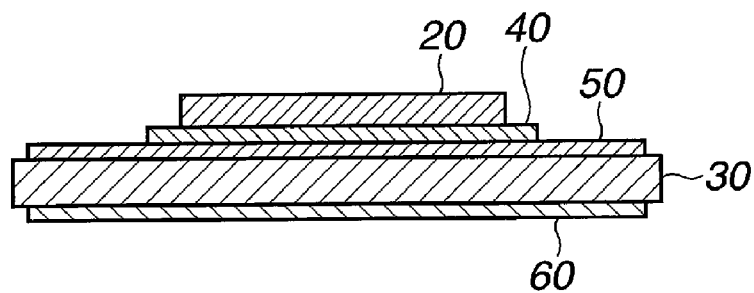
FIG. 2B is a sectional view taken along line 2B-2B of FIG. 2A.

A first embodiment of the invention is described with reference to FIGS. 1, 2A and 2B. The semiconductor device 11 has a semiconductor base or substrate 20, i.e., a semiconductor chip 20, an insulating ceramic plate 30 on which the semiconductor chip 20 is mounted, and a stress buffer (or stress cushioning or absorption section) 40 that eases or lessens a thermal stress. In the drawings, as an example, the stress buffer 40 is provided between the semiconductor base 20 and the insulating ceramic plate 30. The stress buffer 40 is formed from a structure that contains at least Al and a second phase. The second phase is $Al_4X$, where X is at least one element of alkaline earth metal elements. As an example of the alkaline earth metal elements, they are Ca, Sr, Ba, etc.

A wiring metal layer 50 is provided on one side surface of the insulating ceramic plate 30, and a backside metal layer 60 is provided on the other side surface of the insulating ceramic plate 30. Together, wiring metal layer 50, insulating ceramic plate 30 and backside metal layer 60 form a combined or composite base. The semiconductor chip 20 is provided on the wiring metal layer 50 through the stress buffer 40. A heat sink 71 as a cooling member is connected or bonded under the backside metal layer 60. The heat sink 71 is fixed in a case 72 formed from resin. In FIG. 1, one end of each terminal 73 is electrically connected to the semiconductor device 11, and the respective other ends extend outside the case 72. A bonded wire 74 is bonded between wiring metal layer 50 and respective terminals 73 and between wiring metal layer 50 and chip 20.

The stress buffer 40 is a two or double phased structure of Al radical or group. If $Al_4X$ resides as the second group, the stress can be eased or lessened effectively since an elastic modulus becomes low.

Here, the elastic modulus of pure or fine Al is approximately 70 GPa. In the case of the two phase structure as described herein, the elastic modulus is different according to a volume fraction of the second phase and the element of X of $Al_4X$. For instance, when using Ca as X (i.e., $Al_4Ca$), the elastic modulus can be lowered to the order of 30 GPa.

Figure 3:
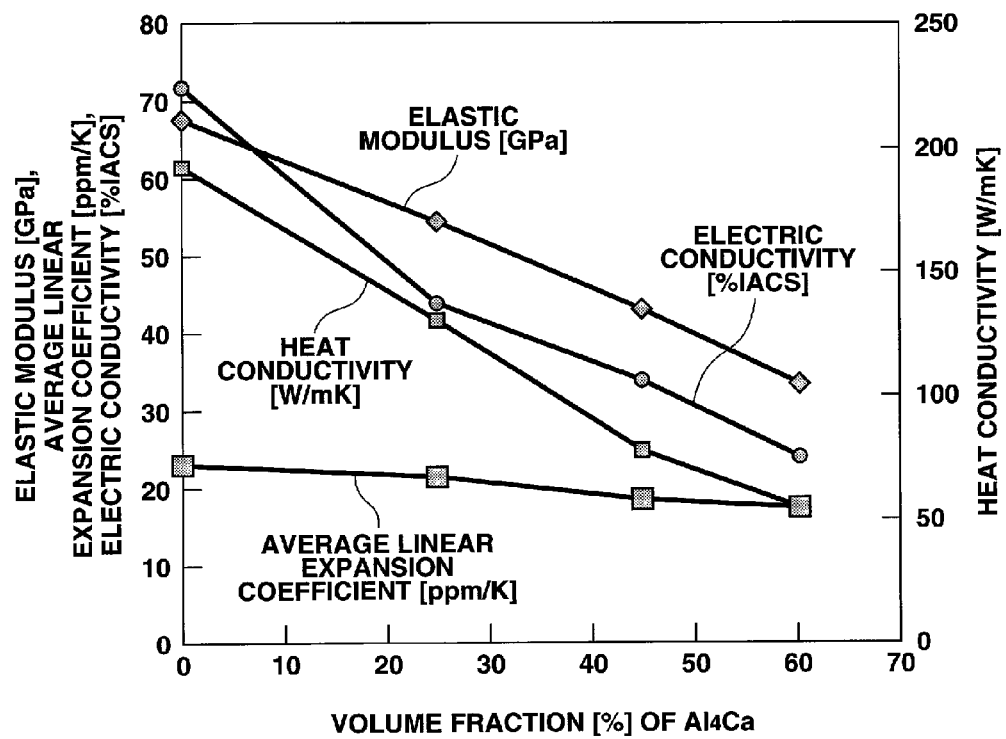
FIG. 3 is a drawing showing characteristic curves of an elastic modulus, a linear expansion coefficient, a heat conductivity and an electric conductivity when changing $Al_4Ca$ volume fraction in Al.

In FIG. 3, illustrates characteristic curves of the elastic modulus, a linear expansion coefficient, a heat conductivity and an electric conductivity when changing $Al_4Ca$ volume fraction in Al in the case where Ca is used as X.

As can be seen from FIG. 3, the linear expansion coefficient is also lowered as compared with the pure Al. If the linear expansion coefficient becomes low, a difference of the linear expansion coefficient with the semiconductor chip 20 or the insulating ceramic plate 30 becomes small. Accordingly, it becomes possible to further lower the produced thermal stress.

The heat conductivity is important for effectively radiating the heat produced in the semiconductor device 11, and the higher, the better for the stress buffer 40. As shown in FIG. 3, the higher the $Al_4Ca$ quantity is, the smaller the heat conductivity. As compared with, for example, an eutectic solder whose solder heat conductivity is about 50 W/mK, a sufficiently high value of the heat conductivity is ensured. It is conceivable that, since a quantity of solution Ca into the Al phase of the two phases is small, the high heat conductivity is held in the Al phase.

The electric conductivity is important for suppressing the production of heat in the semiconductor device 11 and for improving the efficiency, and the higher, the better for the stress buffer 40. This is because as the electric conductivity becomes high, an electric resistance lowers. As shown in FIG. 3, the more the $Al_4Ca$ quantity is increased, the lower the electric conductivity. As compared with, for example, the eutectic solder whose electric conductivity is about 11% IACS, a sufficiently high value of the electric conductivity is ensured. It is conceivable that, since a quantity of solution Ca into the Al phase of the two phases is small, the high electric conductivity is held in the Al phase.

Figure 4:
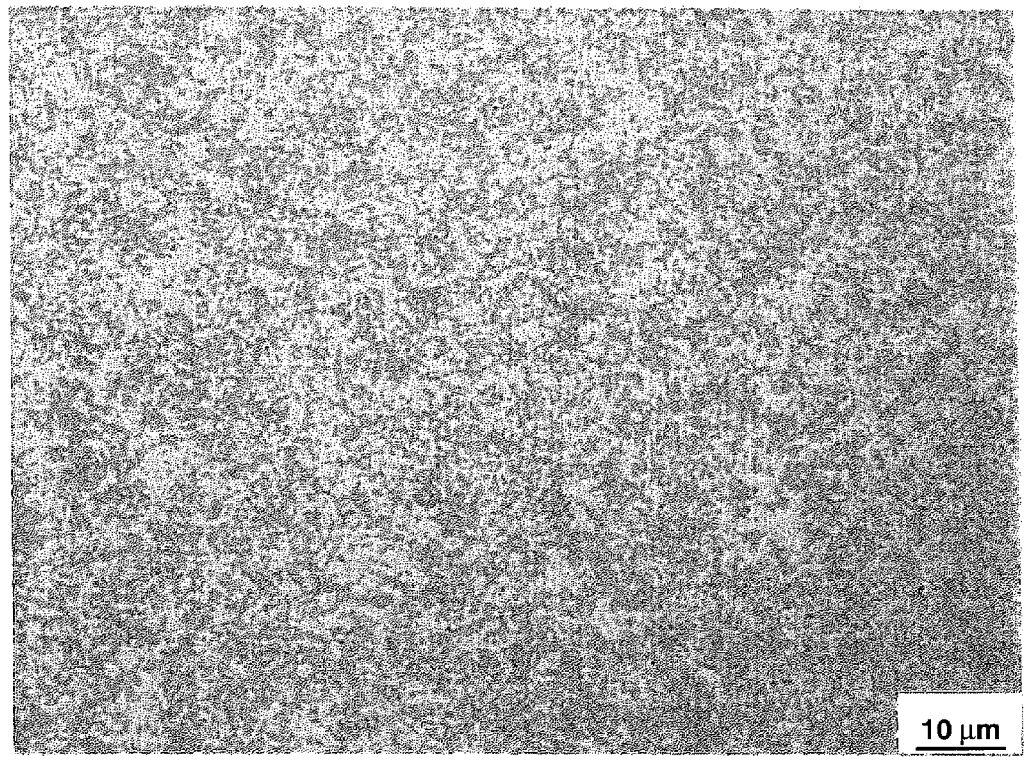
FIG. 4 is a picture of an optical microscope, as an example of a structure photo of a stress buffer (or stress cushioning or absorption section), of a case where $Al_4Ca$ in Al is contained about 47% (Al-9at. % Ca)

FIG. 4 shows a picture of an optical microscope, as an example of a structure photo of the stress buffer 40, in a case where $Al_4Ca$ in Al is contained about 45% (Al-9at. % Ca).

In FIG. 4, the dark color part is $Al_4Ca$, and the light color part is Al. As can be seen in FIG. 4, the minute or microscopic two phase structure is formed. With this structure, even if fatigue builds up due to repeatedly-occurring stress and a crack occurs, its elongation or growth can be retarded or delayed. As a result, this structure also has long-term reliability.

Here, although only the structure photo in the case where X=Ca is shown in FIG. 4, when using Sr or Ba as X the same tendency appears, and the same effect can be achieved. In the case where Ca, Sr and Ba are added into Al, $Al_4Ca$, $Al_4Sr$ and $Al_4Ba$ are respectively formed in an equilibrium condition in 20 atomic weight %. Each structure of these intermetallic compounds is considered to be the same crystal structure as $Al_4Ba$ type (D13), and it is conceivable that these intermetallic compounds have lower elastic modulus than the pure Al, thus the same effect is obtained. Further, since each quantity of solution of Ca, Sr and Ba into Al is small, the heat conductivity and the electric conductivity of the Al phase are not significantly reduced.

In the table of FIG. 14, components and measurement results of alloys that contain $Al_4Ca$ in Al are shown as compared to data of A4032 of a normal Al alloy.

As shown therein, in the case of the alloys of Nos. 1-3, each forming the stress buffer 40 of the present embodiment, the elastic modulus and the linear expansion coefficient are lowered simultaneously, and it has been shown that these alloys are suitable for the stress buffer 40.

The aluminum alloy having a composition shown in the table was made as follows. Using pure metal Al and Ca of purity greater than 99.9%, by atomization, an alloy powder (average particle size: approximately 50 μm) having the composition shown in FIG. 14 was made. After filling a case (diameter 50 mm) with this alloy powder, a de-aeration or de-airing process was carried out at 300 to 400° C., and a rod of the alloy powder of diameter 10 mm was extruded at 400° C.

Comparison example 1 was prepared as a commercial pure Al (A1070) of diameter 10 mm, which was made through a common process and was annealed at 400° C. for an hour.

Comparison example 2 was prepared as an A4032 alloy of diameter 10 mm, which was made through a common process and was provided with a commonly-known T6 process of heat treating and age hardening.

With regard to the above aluminum alloys, the following evaluations were made.

1. Young's Modulus

In conformance with Japanese Industrial Standard (JIS) Z 2280:1993 (High temperature Young's modulus measuring method of metal material), each Young's modulus in a longitudinal direction of a rod of alloys 1 to 3 and comparison examples 1 and 2 was measured at room temperature by a tension test. This measurement result is shown in FIG. 14.

2. X-ray Diffraction (XRD)

Through X-ray diffraction, each component phase of alloys 1 to 3 at room temperature was analyzed. Regarding the X-ray analysis, the rod was crushed into powder first and then was annealed at 300° C. for 10 minutes to remove a distortion. Using this sample, the X-ray analysis was made. Further, a copper (Cu) tube or bulb x-ray diffraction device was used in the X-ray analysis. The component phase was determined by analyzing a peak of XRD pattern. This analysis result is shown in the table of FIG. 14. It was found that any alloy is formed from the two phase structure of Al (a first phase or Al matrix) and $Al_4Ca$ (the second phase).

3. Structure Observation and Volume Fraction of the Second Phase

Each cross section of aluminum alloys 1 to 3, normal to the longitudinal direction of the rod, was observed through an optical microscope. Although the alloy is formed from the two phase structure as mentioned above, by EPMA analysis, the dark color part has been identified as the second phase formed from $Al_4Ca$ and the light color part has been identified as Al.

On the basis of this observation result, a binary operation was executed through image analysis, and an area fraction of the second phase formed from $Al_4Ca$ was determined Likewise, through the picture of the optical microscope, an area fraction of a longitudinal direction (parallel) cross section was also determined. Then the average of this area fraction with the area fraction of the vertical cross section was determined. This average is the volume fraction of the second phase formed from $Al_4Ca$ of each alloy and is shown in FIG. 14. Here, there was no great difference in the structure according to an observation direction between the alloys 1 to 3.

4. Tension Test

In conformance with JIS Z 2241:1998 (Metal material tension testing method), a tensile strength and an elongation of alloys 1 to 3 and comparison examples 1 and 2 were measured by a tension test at room temperature. These results are shown in the table of FIG. 14.

5. Thermal Expansion Coefficient (Average Linear Expansion Coefficient)

By a thermal mechanical analysis performed according to known methods, each average linear expansion coefficient of alloys 1 to 3 and comparison examples 1 and 2 was measured. A shape of a sample is diameter 5 mm Φ×20 mm The average linear expansion coefficient in a temperature range of −50° C. to 300° C. was measured under a condition of temperature rising and falling speeds of 5° C./min The results are shown in FIG. 14.

6. Heat Conductivity

By a known laser flash method, each heat conductivity at room temperature of alloys 1 to 3 and comparison examples 1 and 2 was measured. The heat conductivities are shown in the table of FIG. 14.

7. Electric Conductivity

A four-terminal method for resistivity measurements was performed using a cut sample of 2 mm×2 mm×100 mm for each of the alloys 1 to 3 and comparison example 1. The measured electric conductivities are shown in FIG. 14.

8. Density

By measuring size and weight of alloys 1 to 3 and comparison examples 1 and 2 at room temperature, their densities were calculated. These densities are shown in the table of FIG. 14.

In the table of FIG. 14, an alloy composition other than Al of "A4032" shown in a box of "others" of the component for comparison example 2 is Si at 11.8%, Fe at 0.49%, Cu at 0.43%, Mg at 1.13%, Cr at 0.05%, Zn at 0.1% and Ni at 0.47%. The percentages of each of these compositions is "wt. %".

Figure 5:
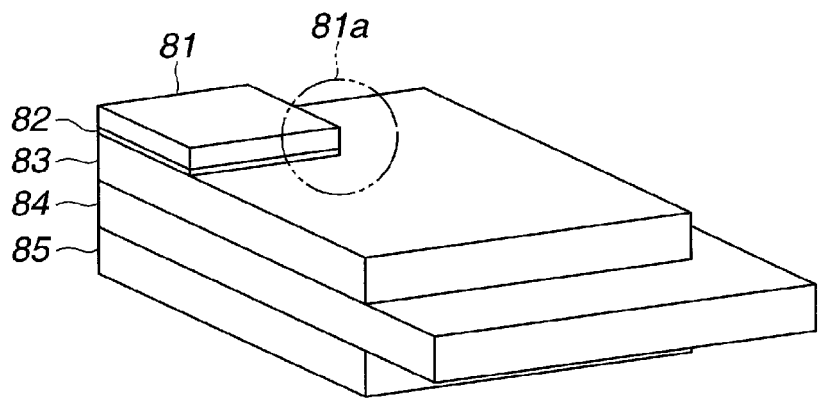
FIG. 5 is a perspective view showing FEM analysis model.

In order to verify the effects of the stress buffer 40, a stress that occurs at a chip corner 81*a* was relatively compared through a finite element method (FEM) analysis using a model shown in FIG. 5.

As the analysis model, a ¼ model was used because of symmetry. The analysis model has a semiconductor chip 81, an intermediate layer 82, a wiring metal layer 83, an insulating ceramic plate 84, and a backside metal layer 85. Thickness and properties of each are shown in the table of FIG. 15.

Figure 6:
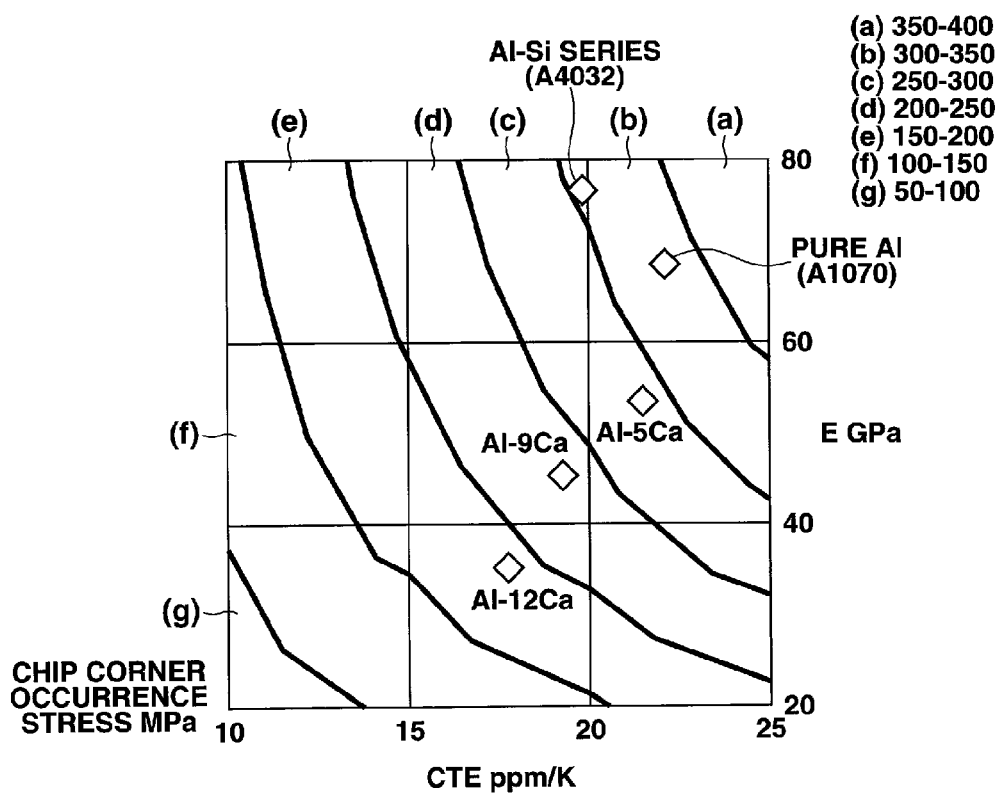
FIG. 6 is a map showing a chip occurrence stress when changing the elastic modulus and the linear expansion coefficient of the stress buffer.

Assuming that the intermediate layer 82, the wiring metal layer 83 and the backside metal layer 85 are formed from the same metal material and all of them are the stress buffers 40, an equivalent stress that occurs around the chip corner 81*a* when providing a temperature difference 280° C. was measured by changing the elastic modulus and linear expansion coefficient. Here, plastic deformation of the material, creep and temperature change of the respective properties are not taken into consideration. FIG. 6 maps data of the chip occurrence stress with respect to an elastic modulus (E) and a linear expansion coefficient (CTE) of the stress buffers (that is, the metal layers). In FIG. 6, the elastic modulus and the linear expansion coefficient of the Al—Ca alloy forming the stress buffer 40 as described with respect to FIGS. 3 and 14 are shown too. For comparison purposes, data of the pure Al (A1070) and A4030 of Al—Si series that is one of the Al alloys are also plotted in FIG. 6.

As shown in FIG. 6, the alloy containing $Al_4Ca$ in Al according to an embodiment of the invention can greatly decrease the stress occurring in the semiconductor chip 20. On the other hand, with regard to the pure Al and the other Al alloy, since they do not obtain a sufficiently low elastic modulus unless $Al_4X$ resides as the second phase, the thermal stress can not be lowered.

With regard to the second phase of the stress buffer 40, it is preferable that the area fraction be greater than or equal to about 5%. If it is smaller than this, sufficient reliability cannot be ensured since the stress buffer lacks the effect of preventing the elongation of the crack and the effect of lowering the elastic modulus is small.

Figure 7:
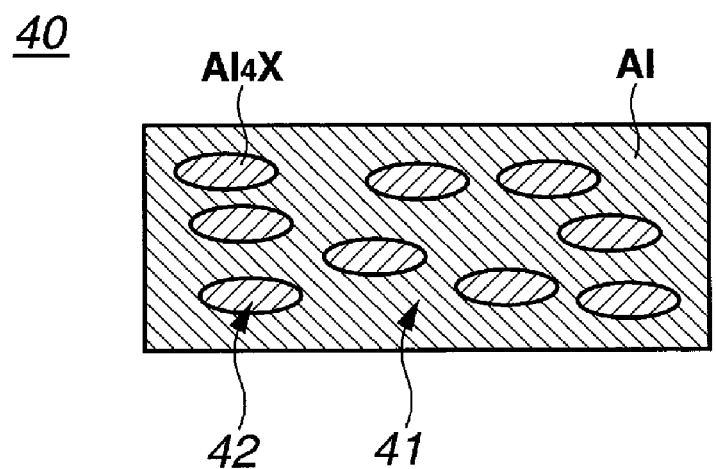
FIG. 7 is a drawing schematically showing a diploid phase structure that forms the stress buffer.

FIG. 7 is a drawing schematically showing a diploid phase structure that forms the stress buffer 40.

As shown in FIG. 7, a second phase 42 of the stress buffer 40 can disperse or be scattered in an Al matrix 41. It is preferable but not necessary that the second phase 42 be scattered uniformly in the Al matrix 41. The reason why it is preferable is that if the Al matrix 41 has a network structure, deterioration of the heat conductivity and the electric conductivity can be suppressed or kept to a minimum since the second phase 42 resides throughout. Also, a sufficient ductility can be ensured.

According to a preferred embodiment, the stress buffer 40 is an aluminum alloy that contains Ca by 3 to 12 at. %. Ca is smaller than Ba in the density, so weight reduction and cost reduction are thus possible. In addition, Ca is greater than Sr in the effect of lowering the elastic modulus. If the Ca quantity becomes less than about 3%, sufficient reliability cannot be ensured since the stress buffer lacks the effect of preventing the elongation of the crack due to a small quantity of the Al$_4$Ca phase and also the effect of lowering the elastic modulus is small. On the other hand, if Ca is contained over about 12 at. %, the heat conductivity and the electric conductivity deteriorate such that a performance of the device can be impaired.

Although the stress buffer 40 has Al as a principal component, Al is a residual, and its content is not limited. For example, the content is not limited as long as an element residing most of all the contained elements is Al by an atomic weight ratio. In particular, when the whole Al alloy is 100 at. %, if Al content is greater than or equal to 70 at. %, this is preferable for high electric conductivity and low elastic modulus. Besides the above components, Mg, Si, Mn, Cu, Fe, P, Ti, Ba, Sr, Cr and Zn, etc., could be compounded to obtain an aluminum alloy for use in the present invention.

A process or production method of the stress buffer 40 is not particularly limited. For example, it could be made by dissolving or melting and rolling a plate of Al—Ca alloy. Further, as a connecting or bonding method of the stress buffer 40 when assembling the semiconductor device 11, direct bonding such as an ultrasonic bonding, a superplasticity bonding and a diffusion bonding is possible. Bonding indirectly using various brazing or soldering is also possible. Alternatively, through sputtering, etc., a thin film could be directly deposited on the insulating ceramic plate.

Returning to FIG. 2, the stress buffer 40 touches the wiring metal layer 50. It is preferable but not necessary that the electric conductivity of the wiring metal layer 50 be greater than that of the stress buffer 40. As described above, for the two phase structure of the stress buffer 40, the electric conductivity and the heat conductivity become a negative factor to some degree. Therefore, only parts that need the cushioning or absorption of the stress formed as the stress buffer 40, and the other parts of the wiring metal layer 50 are, for instance, formed by a high heat and high electric conductivity material such as Cu or Al. With this configuration, a high-efficiency semiconductor device 11 can be obtained.

In addition, it is preferable that the wiring metal layer 50 be formed from Al or Al alloy. If the wiring metal is Al or Al alloy, the semiconductor device 11 has the long term reliability since a weak or tender intermetallic compound is not formed on a boundary between the stress buffer 40 and the wiring metal.

According to the semiconductor device 11 of the first embodiment, the stress buffer 40 has the structure in which Al$_4$X is scattered in Al, and the elastic modulus and the linear expansion coefficient are small. As a result, the elongation of cracks can be prevented. Thus, the thermal stress or the heat distortion or strain occurring during the manufacturing process or during operation of the semiconductor device 11 can be effectively eased or absorbed or lessened, and the semiconductor device 11 can function with stability and reliability for a long time without risk of deformation, denaturation and breakdown. Further, since the members are not directly bonded or connected with each other, there is no need to control the surface smoothness of the respective members more than necessary. This does not require sophisticated processes and does not bring an increase in cost. Moreover, since the operation is also possible at a temperature over the melting point of the solder, the inventive semiconductor device 11 is capable of functioning at high temperature.

Furthermore, since the second phase 42 of the stress buffer 40 is scattered in the Al matrix 41, the Al matrix 41 has a network structure and the second phase 42 resides therein. Deterioration of heat and electric conductivity can be suppressed or kept to the minimum, and sufficient ductility can be ensured.

Since the stress buffer 40 is formed from an aluminum alloy that contains Ca by 3 to 12 at. % in this first embodiment, weight and cost reduction are possible as compared with the case of X=Ba. In addition, Ca is greater than Sr in the effect of lowering the elastic modulus. Since the Ca quantity is 3 to 12 at. %, effects of preventing the elongation of cracks can be sufficiently gained, and sufficient reliability can be ensured. Furthermore, since the Ca quantity is not beyond about 12 at. %, heat and electric conductivity do not deteriorate, and an adequate performance of the device can be ensured.

In addition, by setting the electric conductivity of the wiring metal layer 50 to be greater than that of the stress buffer 40, the decrease of the electric conductivity can be suppressed even with the presence of the stress buffer 40. A high-efficiency semiconductor device 11 can be obtained.

Moreover, by forming the wiring metal layer 50 from Al or Al alloy, the wiring metal layer 50 is formed by high heat and high electric conductivity material, contributing to the high-efficiency of semiconductor device 11. Further, the semiconductor device 11 has long term reliability since a weak or tender intermetallic compound is not formed between the stress buffer 40 and the wiring metal.

In the above embodiment, a semiconductor device 11 in which the stress buffer 40 is provided between the semiconductor chip 20 and the insulating ceramic plate 30 is shown, but the invention is not limited to this device. The stress buffer 40 has a cushioning or absorbing (or buffer) function due to a low Young's modulus and a low linear expansion coefficient and has the effect of improving life through the crack-elongation-suppression of the diploid phase structure. To realize these functions and effects, the stress buffer 40 is provided between the semiconductor chip 20 and the insulating ceramic plate 30, but the stress buffer 40 could be provided at least at one side surface of the insulating ceramic plate 30 that is opposite to a surface on which the semiconductor chip 20 is mounted. Further, the stress buffer 40 could be directly secured or bonded on the semiconductor chip 20 or the insulating ceramic plate 30, or might be indirectly bonded thereon through another intermediate layer. Here, the intermediate layer is, for instance, a thin layer that is provided for the purpose of reducing a contact resistance of the semiconductor chip and touches the semiconductor chip and is formed from Ni, etc., or is a layer that is formed from the same material used when bonding the wiring metal layer to the insulating ceramic plate by brazing.

The stress buffer 40 is not limited as long as the stress buffer 40 is formed from a structure that contains at least Al and the second phase. The alloy structure contains at least the first phase established from Al and the second phase established from Al$_4$X and further could contain other phases (a third or more phases). That is, the stress buffer 40 could be the two phase structure formed from only the Al phase and the Al$_4$X phase and may be a multiple phase structure such as a three or more phase structure formed from the Al phase, the Al$_4$X phase and the other phases (one or more phases).

Figure 8:
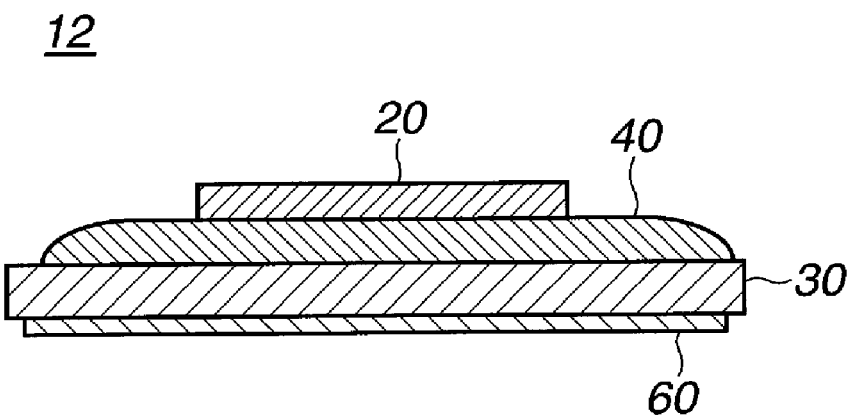
FIG. 8 is a sectional view showing a semiconductor device according to a second embodiment of the invention.

In the first embodiment, the stress buffer 40 and the wiring metal layer 50 are separately provided. However, in the second embodiment shown in FIG. 8, the stress buffer 40 has the wiring metal layer or serves as the wiring metal layer.

In the second embodiment, in addition to the effects of the first embodiment, since the whole part of the wiring metal is the stress buffer 40, there are fewer boundaries or interface surfaces of different kind of materials, and a risk of breakdown on the boundary can be suppressed. It is then possible to provide the semiconductor device 12 having even higher reliability.

Figure 9A:
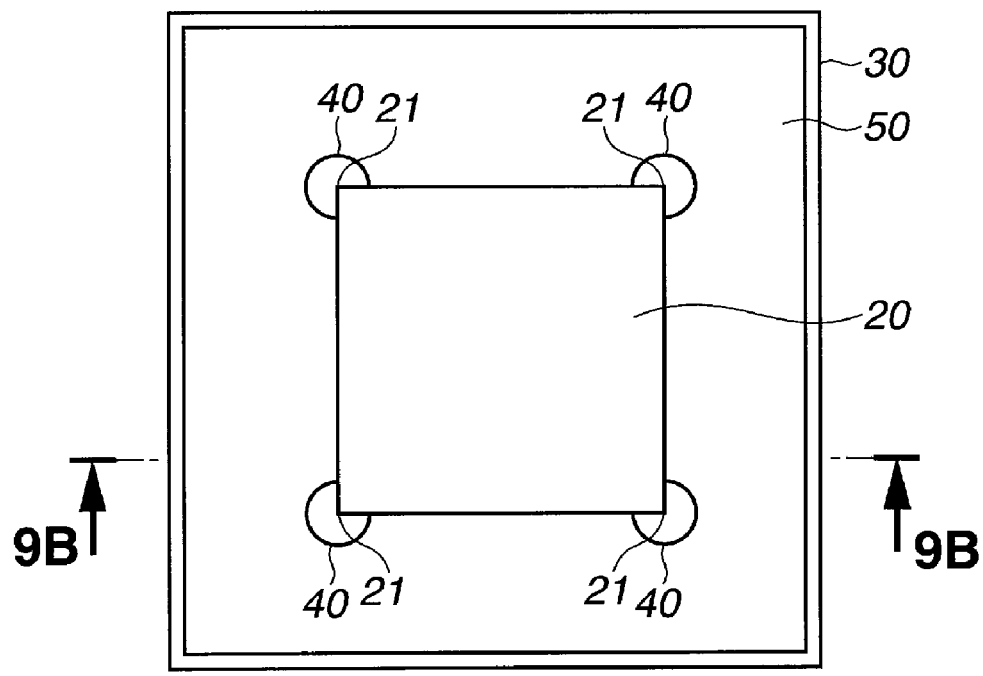
FIG. 9A is a plan view of the semiconductor device according to a third embodiment of the invention.
Figure 9B:
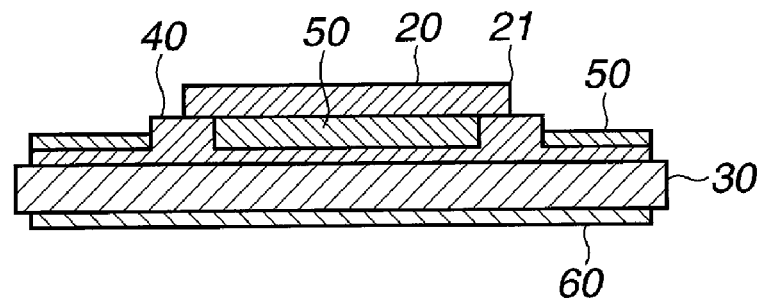
FIG. 9B is a sectional view taken along line 9B-9B of FIG. 9A.

In the first embodiment, the stress buffer 40 is arranged so that the stress buffer 40 touches the whole back surface of the semiconductor chip 20. However, in the third embodiment shown in FIGS. 9A and 9B, the stress buffer 40 is arranged or formed so that the stress buffer 40 touches corner portions 21 of the semiconductor chip 20.

In the third embodiment, it is preferable that the stress buffer 40 be arranged in a position where the stress buffer 40 touches at least the corner portions 21 of the semiconductor chip 20. The thermal stress or the heat distortion or strain occurring during the manufacturing process or during operation of the semiconductor device 11 concentrates around the corner portions 21 of the semiconductor chip 20. In addition, the semiconductor is fragile, and a portion around the corner portion 21 tends to break. For this reason, in order to secure the reliability of the device, it is preferable that the stress buffer 40 be arranged in the position where the stress buffer 40 touches the corner portions 21 of the semiconductor chip 20. As the wiring metal, Al and/or Cu can be selected.

In the third embodiment, in addition to the effects of the first embodiment, a risk of break and breakdown of the corner portions 21 of the semiconductor chip 20 can be suppressed since the stress buffer 40 is arranged in the position where the stress buffer 40 touches the corner portions 21 of the semiconductor chip 20. It is then possible to provide the semiconductor device 13 having a high reliability. Further, since the stress buffer 40 is arranged only in the position where the stress buffer 40 touches the corner portions 21 of the semiconductor chip 20, by selecting Al and/or Cu as the wiring metal, both high electric conductivity and high heat conductivity are included. Accordingly, the semiconductor device 13 has a high heat radiation performance.

Figure 10:
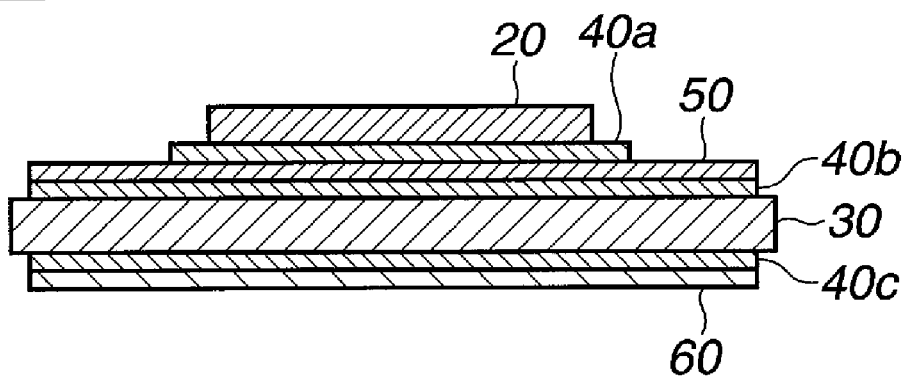
FIG. 10 is a sectional view showing a semiconductor device according to a fourth embodiment of the invention.

In the first embodiment, the stress buffer 40 is provided only between the semiconductor chip 20 and the wiring metal layer 50. However, in the fourth embodiment shown in FIG. 10, stress buffers 40a, 40b and 40c are provided between the semiconductor chip 20 and the wiring metal layer 50, between the wiring metal layer 50 and the insulating ceramic plate 30, and between the insulating ceramic plate 30 and the backside metal layer 60, respectively.

Al is used as the wiring metal forming the wiring metal layer 50. Because of this, a weak or tender intermetallic compound is not formed on boundaries between the stress buffer 40a and an upper surface of the wiring metal layer 50 and between a lower surface of the wiring metal layer 50 and the stress buffer 40b. Thus, the semiconductor device 14 has a high reliability.

Furthermore, by arranging the stress buffers 40b and 40c in positions where these buffers touch the insulating ceramic plate 30, a greater effect can be obtained. That is, since thermal stress occurs as a result of the difference of the linear expansion coefficient, the thermal stress concentrates at the boundaries between the semiconductor chip 20, the insulating ceramic plate 30 having a low linear expansion coefficient as compared with the metal, and the metal layer 50, 60, respectively. Thus, by arranging the stress buffers 40b and 40c between the insulating ceramic plate 30 and the metal layer 50, 60, which is a stress concentration portion, the breakdown of the insulating ceramic plate 30 and an exfoliation at the boundary can be prevented, resulting in further improvements to the reliability.

In the fourth embodiment, in addition to the effects of the first embodiment, a risk of breakdown at boundaries between the stress buffer 40a and the upper surface of the wiring metal layer 50 and between the lower surface of the wiring metal layer 50 and the stress buffer 40b can be suppressed since Al is used as the wiring metal forming the wiring metal layer 50. It is then possible to provide the semiconductor device 14 having a high reliability. Further, since the stress buffers 40b and 40c are arranged in the positions where these buffers touch the insulating ceramic plate 30, the breakdown of the insulating ceramic plate 30 and the exfoliation at the boundary can be prevented. This further improves the reliability.

Figure 11:
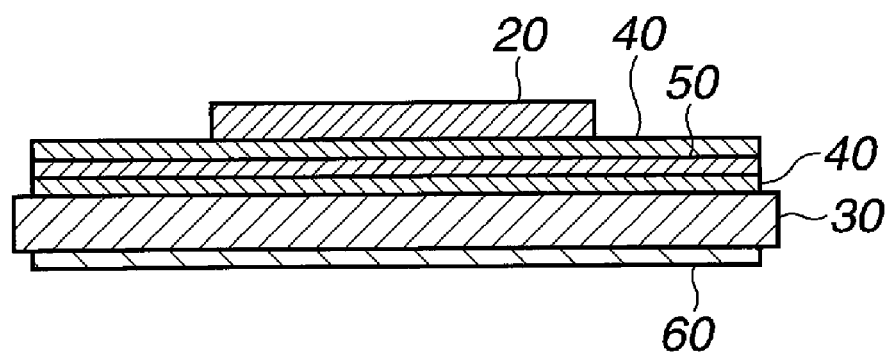
FIG. 11 is a sectional view showing a semiconductor device according to a fifth embodiment of the invention.

In the fifth embodiment of a semiconductor device 15 as shown in FIG. 11, an area of the stress buffer 40 on the side of the semiconductor chip 20 becomes large in contrast with that of the fourth embodiment.

In the fifth embodiment, it is preferable that stress absorbing or buffer sheets (similar to a brazing sheet), on which a plate member having a structure in which $Al_4X$ is scattered in Al forming the stress buffers 40 is bonded through cladding, be formed in advance on both surfaces of Al of the wiring metal. By using this stress absorbing sheet in an assembling process of the semiconductor device 15, a process or manufacturing cost of the semiconductor device 15 can be reduced in addition to the effects of the fourth embodiment.

Figure 12A:
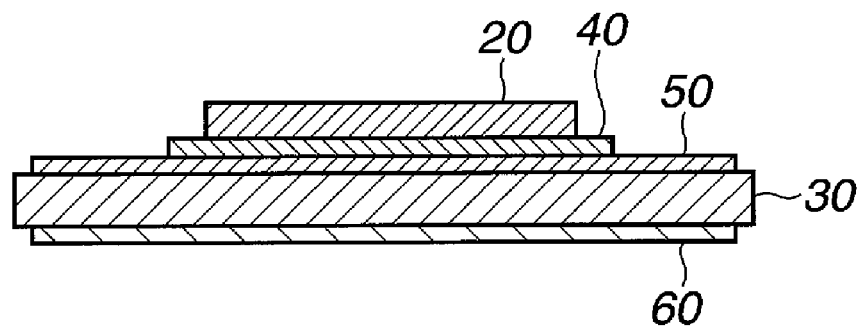
FIG. 12A is a sectional view showing a semiconductor device according to a sixth embodiment of the invention.
Figure 12B:
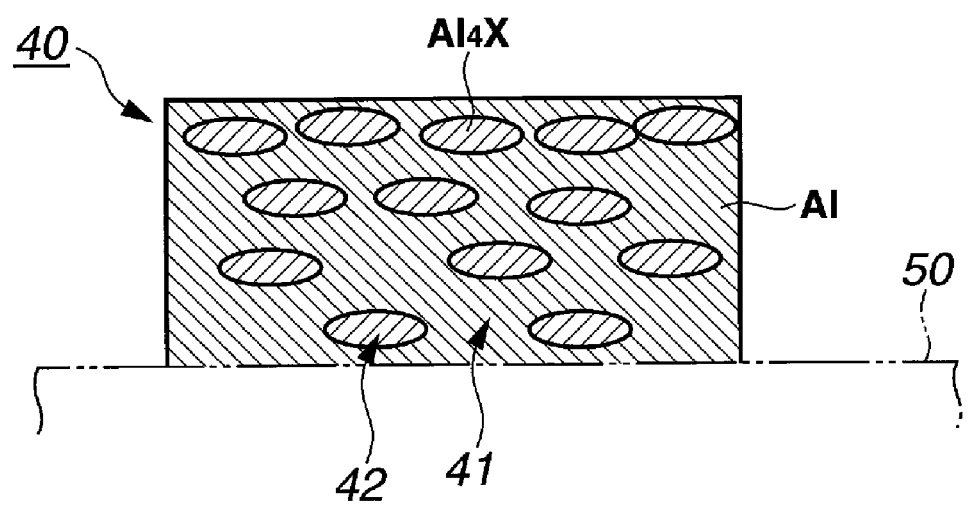
FIG. 12B is a drawing schematically showing a diploid phase structure that forms the stress buffer.

In the sixth embodiment shown in FIGS. 12A and 12B, the volume fraction of the second phase 42 in the stress buffer 40 is gradually reduced as its position becomes closer to the boundary between the stress buffer 40 and the wiring metal layer 50.

As previously explained in the first embodiment, it is preferable that the electric conductivity of the wiring metal layer 50 touched by the stress buffer 40 be greater than that of the stress buffer 40. Further, it is preferable that the wiring metal layer 50 be formed from Al or Al alloy.

In the sixth embodiment, in addition, the structure is controlled so that the volume fraction of the second phase 42 in the stress buffer 40 is gradually reduced as its position becomes closer to the boundary between the stress buffer 40 and the wiring metal layer 50. More specifically, although Al is used as the wiring metal, the structure control is carried out so that quantity of $Al_4X$ around the boundary between the wiring metal layer 50 and the stress buffer 40 is gradually reduced as its position becomes closer to the wiring metal layer 50. With this structure or structure control, stress concentration at the boundary between the wiring metal layer 50 and the stress buffer 40 can be prevented. Furthermore, since the semiconductor device 16 is provided with high electric conductivity and high heat radiation performance and is able to effectively ease or lessen the thermal stress as well, it is possible to provide the semiconductor device 16 having a high reliability. The stress buffer 40 formed by the structure control can be formed, for example, through a sintering.

In the sixth embodiment, in addition to the effects of the first embodiment, stress concentration at the boundary between the wiring metal layer 50 and the stress buffer 40 can be prevented since the structure control is carried out so that the volume fraction of the second phase 42 in the stress buffer 40 is gradually reduced as its position becomes closer to the boundary between the stress buffer 40 and the wiring metal layer 50. As a result, the semiconductor device 16 is provided with reliability for a longer time.

Figure 13A:
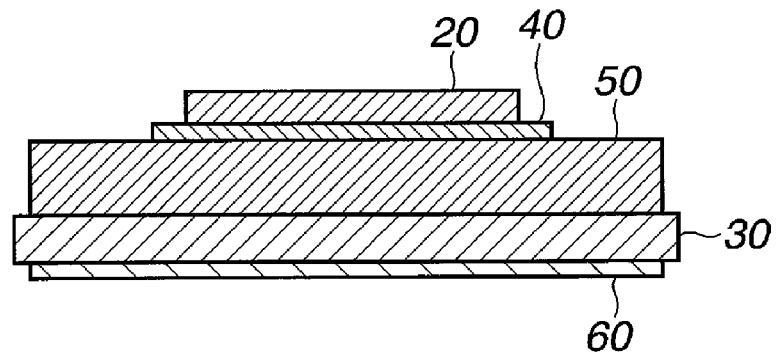
FIG. 13A is a sectional view showing a semiconductor device according to a seventh embodiment of the invention.
Figure 13B:
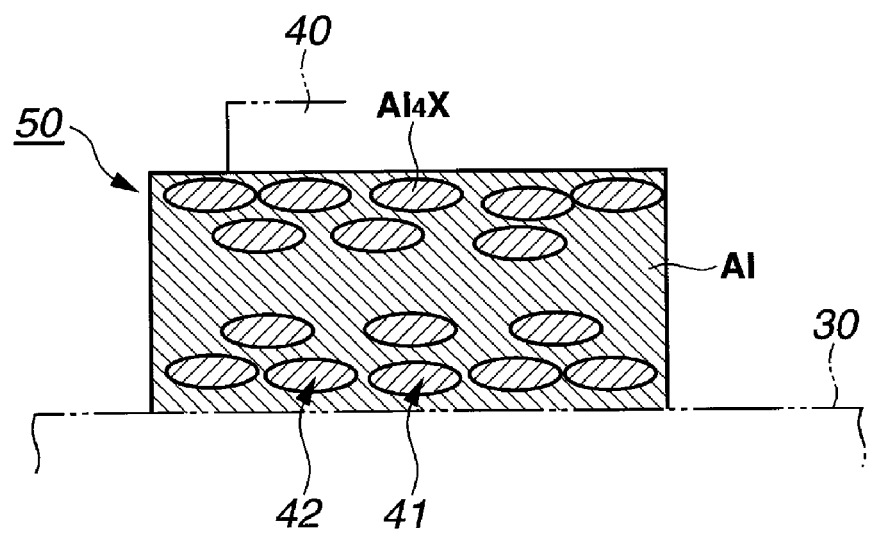
FIG. 13B is a drawing schematically showing a wiring metal layer that is formed from a diploid phase structure forming the stress buffer.

In the seventh embodiment of a semiconductor device 17 shown in FIGS. 13A and 13B, the wiring metal layer 50 is also formed from the diploid phase structure forming the stress buffer 40 in contrast to the first embodiment. In addition, structure control is carried out as in the sixth embodiment.

Although the wiring metal layer 50 is also formed from the diploid phase structure forming the stress buffer 40, the structure control is carried out so that quantities of $Al_4X$ around the boundary between the wiring metal layer 50 and the stress buffer 40 on the side of the semiconductor chip 20 and around the boundary between the wiring metal layer 50 and the insulating ceramic plate 30 are gradually increased as their positions become closer to the respective boundaries. Further, the structure of the wiring metal layer 50 is controlled so that quantity of $Al_4X$ around a substantially middle area is reduced closer to the middle area. With this structure or structure control, stress concentration at the boundary on the side of the semiconductor chip 20 and the boundary between the wiring metal layer 50 and the insulating ceramic plate 30 can be prevented. Further, high electric conductivity and high heat radiation performance in the middle area of the wiring metal layer 50 can be ensured. Thus, it is possible to provide the semiconductor device 17 with a high reliability. The stress buffer 40 formed by the structure control can be formed, for example, through a sintering.

In the seventh embodiment, in addition to the effects of the first embodiment, the semiconductor device 17 can be provided with reliability for a longer time since the wiring metal layer 50 is formed from the diploid phase structure forming the stress buffer 40 and the structure of the wiring metal layer 50 is controlled such that stress concentration at the boundary on the side of the semiconductor chip 20 and the boundary between the wiring metal layer 50 and the insulating ceramic plate 30 is prevented.

The above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A semiconductor device comprising:
   a semiconductor substrate;
   an insulating ceramic plate on which the semiconductor substrate is mounted; and
   at least one stress buffer that eases a thermal stress and is provided between the semiconductor substrate and the insulating ceramic plate, the stress buffer being formed from a structure that contains at least Al and a second phase of $Al_4X$ wherein X is at least one element of alkaline earth metal elements.

2. The semiconductor device as claimed in claim 1, wherein:
   the stress buffer is formed from an aluminum alloy including Ca by about 3 to about 12 at. %.

3. The semiconductor device as claimed in claim 1, wherein:
   the stress buffer is arranged in a position where the stress buffer touches corner portions of the semiconductor substrate.

4. The semiconductor device as claimed in claim 1, wherein:
   the stress buffer is in physical contact with the insulating ceramic plate.

5. The semiconductor device as claimed in claim 1, further comprising:
   a wiring metal layer in contact with at least one surface of the insulating ceramic plate, and wherein
   the stress buffer touches the wiring metal layer, and an electric conductivity of the wiring metal layer is greater than that of the stress buffer.

6. The semiconductor device as claimed in claim 5, wherein:
   the wiring metal layer is formed from Al or an Al alloy.

7. The semiconductor device as claimed in claim 5, wherein:
   a volume fraction of the second phase is gradually reduced as a position of the second phase becomes closer to a boundary between the stress buffer and the wiring metal layer.

8. The semiconductor device as claimed in claim 1, wherein:
   the second phase is scattered in an Al matrix.

9. The semiconductor device as claimed in claim 8, wherein:
   the stress buffer is arranged in a position where the stress buffer touches corner portions of the semiconductor substrate.

10. The semiconductor device as claimed in claim 8, wherein:
    the stress buffer is in physical contact with the insulating ceramic plate.

11. The semiconductor device as claimed in claim 8, further comprising:
    a wiring metal layer in contact with at least one surface of the insulating ceramic plate, and wherein
    the stress buffer touches the wiring metal layer, and an electric conductivity of the wiring metal layer is greater than that of the stress buffer.

12. The semiconductor device as claimed in claim 11, wherein:
    a volume fraction of the second phase is gradually reduced as a position of the second phase becomes closer to a boundary between the stress buffer and the wiring metal layer.

13. The semiconductor device as claimed in claim 12, wherein:
    the wiring metal layer is formed from Al or an Al alloy.

* * * * *